United States Patent
Lin et al.

(10) Patent No.: US 10,147,498 B1
(45) Date of Patent: Dec. 4, 2018

(54) SHIFT REGISTER DEVICE

(71) Applicant: Chunghwa Picture Tubes, LTD., Taoyuan City (TW)

(72) Inventors: Yu-Sheng Lin, New Taipei (TW); Wei-Lien Sung, Taoyuan (TW)

(73) Assignee: Chunghwa Picture Tubes, LTD., Taoyuan (TW)

(*) Notice: Subject to any disclaimer, the term of this patent is extended or adjusted under 35 U.S.C. 154(b) by 0 days.

(21) Appl. No.: 15/933,382

(22) Filed: Mar. 23, 2018

(30) Foreign Application Priority Data

Feb. 1, 2018 (CN) .......................... 2018 1 0103046

(51) Int. Cl.
*G06F 1/04* (2006.01)
*G11C 19/28* (2006.01)
*G11C 19/18* (2006.01)

(52) U.S. Cl.
CPC .......... *G11C 19/287* (2013.01); *G11C 19/188* (2013.01); *G09G 2310/0286* (2013.01)

(58) Field of Classification Search
None
See application file for complete search history.

(56) References Cited

U.S. PATENT DOCUMENTS

2010/0150301 A1* 6/2010 Chan ...................... G11C 19/28
377/64
2016/0275847 A1* 9/2016 Lin .......................... G06F 1/04

FOREIGN PATENT DOCUMENTS

CN 105206238 12/2015

* cited by examiner

*Primary Examiner* — Long Nguyen
(74) *Attorney, Agent, or Firm* — JCIPRNET

(57) ABSTRACT

A shift register device including a plurality of shift registers is provided. The shift registers are coupled to each other in series, where an $N^{th}$ stage shift register includes a voltage setting circuit, at least two control signal generators, at least two backup control signal generators and an output stage circuit. The at least two control signal generators are coupled to a first control terminal and a second control terminal, and the at least two backup control signal generators respectively receive at least two backup bias voltages, and respectively generate the first control voltage and the second control voltage according to the at least two backup bias voltages.

10 Claims, 5 Drawing Sheets

SHIFT REGISTER DEVICE

CROSS-REFERENCE TO RELATED APPLICATION

This application claims the priority benefit of China application serial no. 201810103046.4, filed on Feb. 1, 2018. The entirety of the above-mentioned patent application is hereby incorporated by reference herein and made a part of this specification.

BACKGROUND OF THE INVENTION

Field of the Invention

The invention relates to a shift register device, and particularly relates to a shift register device having selectivity for different operating frequencies.

Description of Related Art

In recent years, along with quick development of semiconductor technology, portable electronic products and flat panel displays are widely used. Among various types of the flat panel displays, a liquid crystal display (LCD) has become a mainstream of all display products due to its advantages of low voltage operation, no radiation, light weight and small volume, etc. Therefore, the development technology of all manufacturers on the LCD is driven towards a trend of more miniaturization and low manufacturing cost.

In order to reduce the manufacturing cost of the LCD, some manufacturers suggest directly fabricating multi-stage shift registers on a glass substrate by using thin-film transistors (TFTs) to replace a commonly used gate driving chip, so as to decrease the manufacturing cost of the LCD.

Meanwhile, in order to meet the needs of light and slim and high operation sensitivity of an electronic device, an in-cell touch panel has become a key product of touch application, as today's gate on array (GOA) and in-cell touch technology become more and more mature, by applying the same to the display panel, not only a border of the display panel is reduced and a GOA circuit and a plug-in touch control circuit are saved, but also a solution of integrating touch control and a display driver is also achieved.

When the in-cell touch panel is used, one of operating frequencies of a plurality of sensing signals is generally selected to implement design. In the design, the operating frequency with better touch sensitivity is generally considered in priority, however, a disadvantage of such operating frequency is that when a long-time reliability operation (a high temperature operation or a high temperature and high humidity operation) is performed, components are easy to fail, and in the design of the conventional GOA circuit, it is unable to have selectivity for different operating frequencies at the same time.

SUMMARY OF THE INVENTION

The invention is directed to a shift register, which is used for setting a gate on array (GOA) circuit, such that the GOA circuit have selectivity for different operating frequencies.

The invention provides a shift register device including a plurality of shift registers, and the shift registers are coupled to each other in series, where an $N^{th}$ stage shift register includes a voltage setting circuit, at least two control signal generators, at least two backup control signal generators and an output stage circuit. The voltage setting circuit receives a start scanning signal and an $(N+1)^{th}$ stage output signal, and provides a first voltage or a second voltage to a driving terminal according to the start scanning signal and the $(N+1)^{th}$ stage output signal, where the start scanning signal is an $(N-1)^{th}$ stage output signal. The at least two control signal generators are coupled to a first control terminal and a second control terminal, and the at least two control signal generators respectively receive at least two bias voltages, and respectively generate a first control voltage on the first control terminal and a second control voltage on the second control terminal according to the at least two bias voltages. The at least two backup control signal generators are coupled to the first control terminal and the second control terminal, and the at least two backup control signal generators respectively receive at least two backup bias voltages, and respectively generate the first control voltage and the second control voltage according to the at least two backup bias voltages. The output stage circuit is coupled to the driving terminal, the first control terminal and the second control terminal, and generates an output signal according to a voltage on the driving terminal, the first control voltage and the second control voltage, where N is a positive integer.

Based on the above description, in the shift register device of the invention, by additionally adding at least two backup control signal generators, besides that the GOA circuit may be operated in the operating frequency with better tough sensitivity through the original at least two control signal generates, the GOA circuit may also be operated in other different operating frequencies through the additionally added at least two backup control signal generators, so as to have selectivity for different operating frequencies. Moreover, by enlarging an aspect ratio of transistors in the backup control signal generators, reliability of the circuit in long-time operation is increased.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
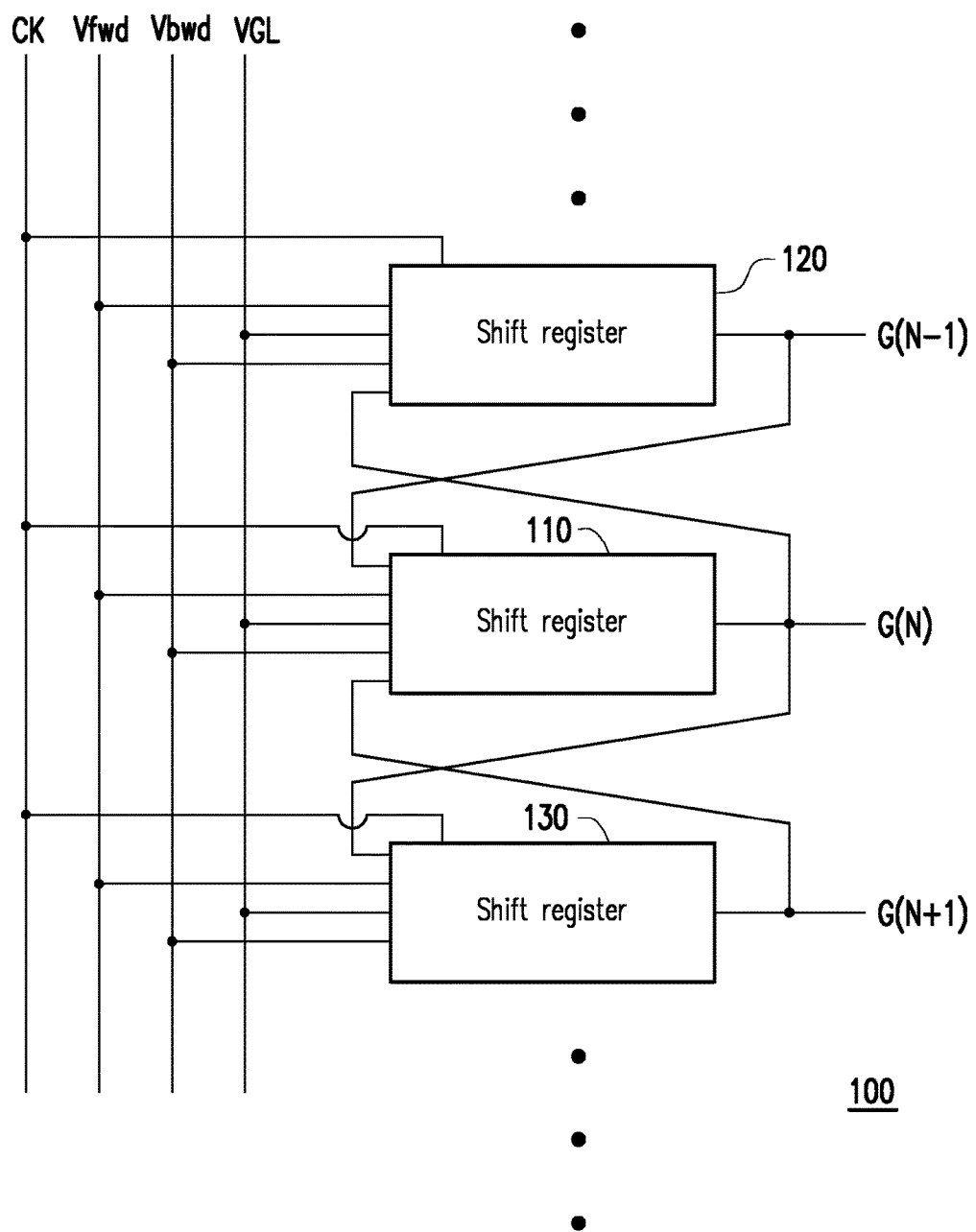
FIG. 1 is a schematic diagram of a shift register device according to an embodiment of the invention.

Referring to FIG. 1, FIG. 1 is a schematic diagram of a shift register device according to an embodiment of the invention. The shift register device 100 includes a plurality of shift registers 110, 120, 130, and for simplicity's sake, only the shift registers 110, 120, 130 of an $(N-1)^{th}$ stage to an $(N+1)^{th}$ stage are shown, where N is a positive integer. Taking the shift register 110 of the $N^{th}$ stage as an example, the shift register 110 receives an $(N-1)^{th}$ stage output signal G(N-1), a clock signal CK, a first voltage Vfwd, a second voltage Vbwd, an $(N+1)^{th}$ stage output signal G(N+1) and a gate low voltage VGL to generate an output signal G(N). The shift register 110 generates the output signal G(N) with the same voltage level as that of the clock signal CK according to the first voltage Vfwd, and pulls down the voltage level of the output signal G(N) to the gate low voltage VGL according to the voltage Vbwd. Moreover, the output signal G(N) is provided to the $(N-1)^{th}$ stage shift register 120 to serve as an input signal, and is provided to the $(N+1)^{th}$ stage shift register 130 to serve as an input signal.

Figure 2:
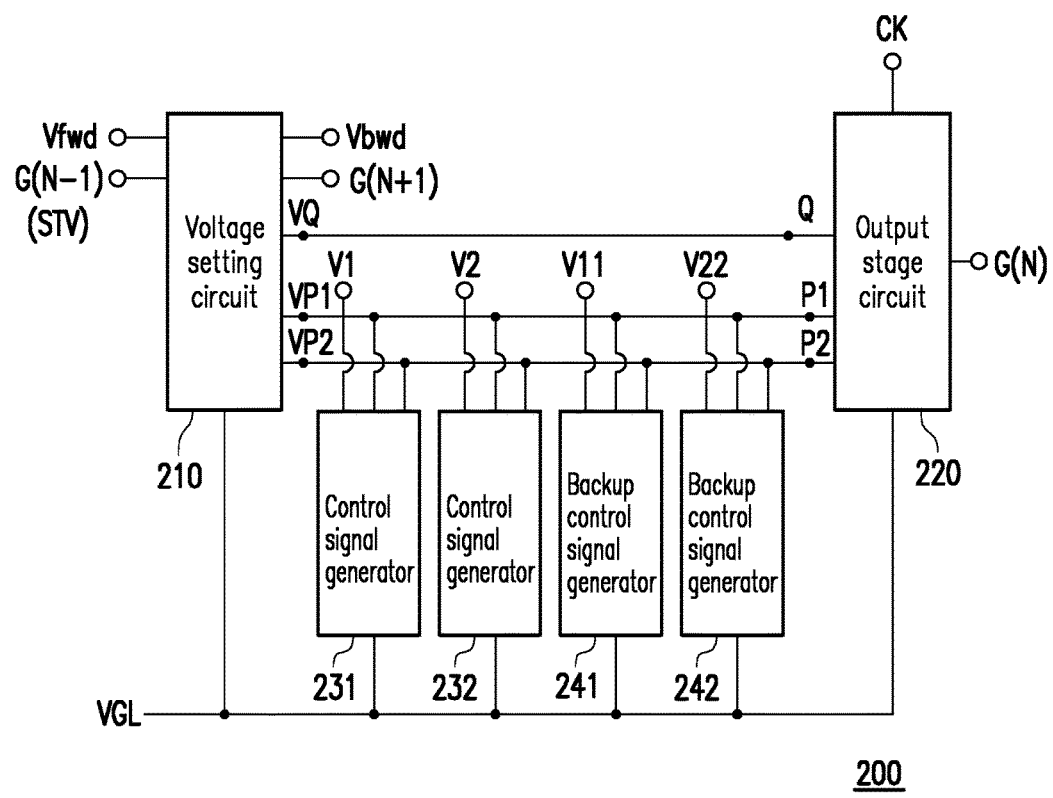
FIG. 2 is a schematic diagram of a shift register according to an embodiment of the invention.

Referring to FIG. 2 for an implementation of the shift register, and FIG. 2 is a schematic diagram of a shift register according to an embodiment of the invention. In the embodiment of FIG. 2, the shift register 200 includes a voltage setting circuit 210, an output stage circuit 220, control signal generators 231 and 232 and backup control signal generators 241 and 242. The voltage setting circuit 210 is coupled to a driving terminal Q, a first control terminal P1 and a second control terminal P2, and receives the gate low voltage VGL, the first voltage Vfwd, the second voltage Vbwd, the $(N+1)^{th}$ stage output signal G(N+1) and the $(N-1)^{th}$ stage output signal G(N-1). The output stage circuit 220 is coupled to the driving terminal Q, the first control terminal P1 and the second control terminal P2, and receives the gate low voltage VGL and the clock signal CK, and the output stage circuit 220 is used for generating the output signal G(N). The control signal generators 231 and 232 and the backup control signal generators 241 and 242 are coupled to the first control terminal P1 and the second control terminal P2, and commonly receive the gate low voltage VGL, and respectively receive bias voltages V1, V2 and backup bias voltages V11, V22, where the control signal generators 231 and 232 and the backup control signal generators 241 and 242 are enabled in time-division, and are used for generating a first control voltage VP1 and a second control voltage VP2 on the first control terminal P1 and the second control terminal P2.

According to the above description, the voltage setting circuit 210 receives a start scanning signal STV and the $(N+1)^{th}$ stage output signal G(N+1), and provides the first voltage Vfwd to the driving terminal Q according to the start scanning signal STV, and provides the second voltage Vbwd to the driving terminal Q according to the $(N+1)^{th}$ stage output signal G(N+1) serving as a close signal. In the present embodiment, the start scanning signal STV is the $(N-1)^{th}$ stage output signal G(N-1), and when the circuit operates, at most one of the first bias voltage V1, the second bias voltage V2, the first backup bias voltage V11 and the second backup bias voltage V22 is an enable voltage level, so as to enable the control signal generators 231 and 232 and the backup control signal generators 241 and 242 in time-division. In the present embodiment, the enable voltage level is a relatively higher voltage level, for example, the first bias voltage V1 is set as the enable voltage level, the voltage level of the first bias voltage V1 is higher than the voltage levels of the second bias voltage V2, the first backup bias voltage V11 and the second backup bias voltage V22.

In view of a detailed operation of the shift registers of the embodiment of the invention, when the first bias voltage V1 is the enable voltage level, the first control signal generator 231 pulls down the first control voltage VP1 to the gate low voltage VGL according to the first bias voltage V1, and pulls up the voltage level of the second control voltage VP2 according to the first bias voltage V1. When the second bias voltage V2 is the enable voltage level, the second control signal generator 232 pulls up the voltage level of the first control voltage VP1 according to the second bias voltage V2, and pulls down the second control voltage VP2 to the gate low voltage VGL according to the second bias voltage V2.

On the other hand, when the first backup bias voltage V11 is the enable voltage level, the first backup control signal generator 241 pulls down the first control voltage VP1 to the gate low voltage VGL according to the first backup bias voltage V11, and pulls up the voltage level of the second control voltage VP2 according to the first backup bias voltage V11. When the second backup bias voltage V22 is the enable voltage level, the second backup control signal generator 242 pulls up the voltage level of the first control voltage VP1 according to the second backup bias voltage V22, and pulls down the second control voltage VP2 to the gate low voltage VGL according to the second backup bias voltage V22.

The output stage circuit 220 generates the output signal G(N) according to a voltage VQ on the driving terminal Q, the first control voltage VP1 and the second control voltage VP2. When the voltage VQ on the driving terminal Q is the enable voltage level, the output signal G(N) with the same voltage level as that of the clock signal CK is generated. When the first control voltage VP1 or the second control voltage VP2 is the enable voltage level, the voltage level of the output signal G(N) is pulled down to the gate low voltage VGL.

It should be noted that the number of the control signal generators 231, 232 and the number of the backup control signal generators 241, 242 shown in FIG. 2 are all two. However, in other embodiments of the invention, the number of the control signal generators and the number of the backup control signal generators may be more than two, which is not limited by the invention.

Figure 3A:
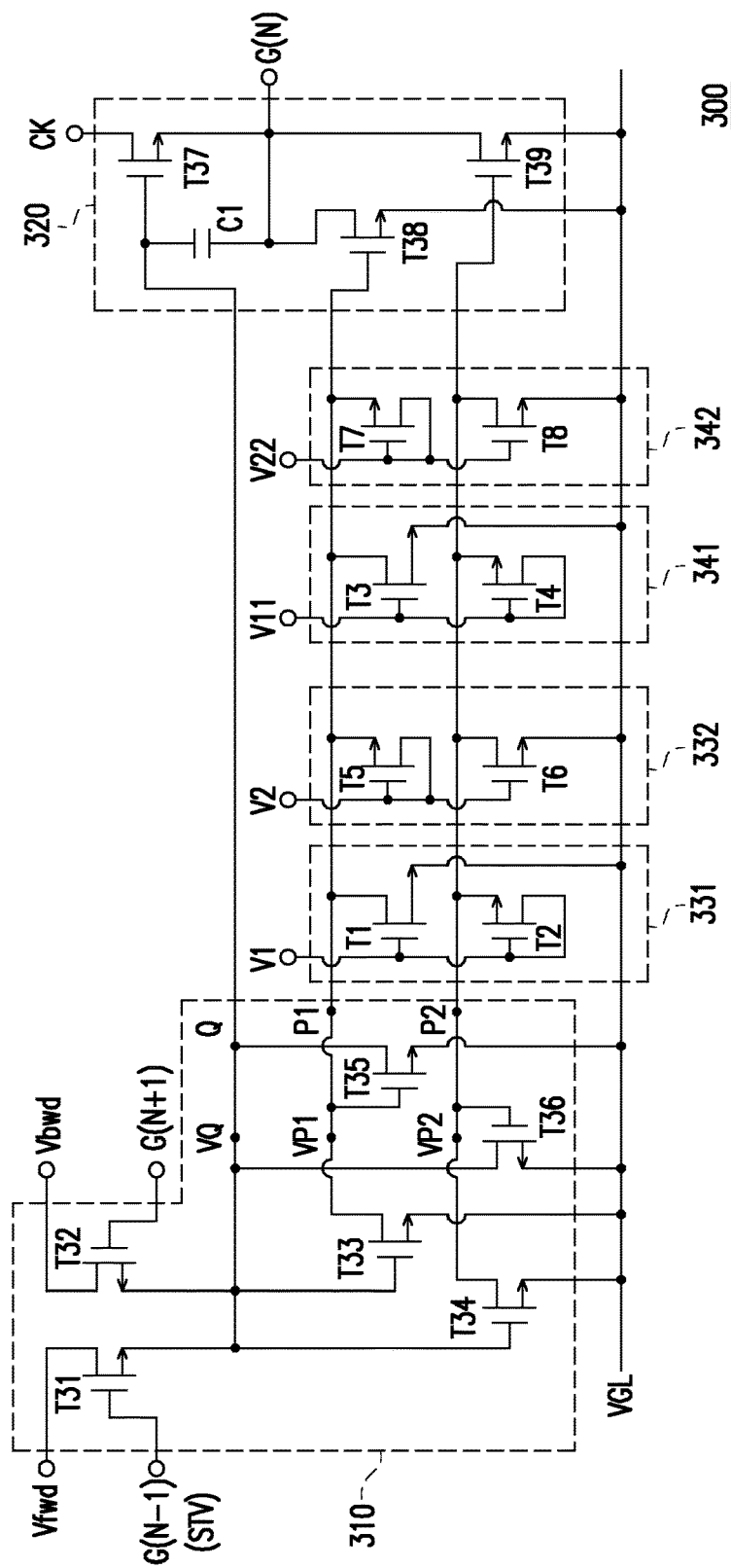
FIG. 3A is a schematic diagram of a shift register according to another embodiment of the invention.

Referring to FIG. 3A, FIG. 3A is a schematic diagram of a shift register according to another embodiment of the invention. In the shift register 300 of the present embodiment, the voltage setting circuit 310 includes transistors T31-T36. A first terminal of the transistor T31 receives the first voltage Vfwd, a control terminal thereof receives the start scanning signal STV (i.e. the $(N-1)^{th}$ stage output signal G(N-1)) and a second terminal thereof is coupled to the driving terminal Q. A first terminal of the transistor T32 receives the second voltage Vbwd, a control terminal thereof receives the $(N+1)^{th}$ stage output signal G(N+1) and a second terminal thereof is coupled to the driving terminal Q. A first terminal of the transistor T33 is coupled to the first control terminal P1, a control terminal thereof is coupled to the driving terminal Q and a second terminal thereof is coupled to the gate low voltage VGL. A first terminal of the transistor T34 is coupled to the second control terminal P2, a control terminal thereof is coupled to the driving terminal Q and a second terminal thereof is coupled to the gate low voltage VGL. A first terminal of the transistor T35 is coupled to the driving terminal Q, a control terminal thereof is coupled to the first control terminal P1 and a second terminal thereof is coupled to the gate low voltage VGL. A first terminal of the transistor T36 is coupled to the driving terminal Q, a control terminal thereof is coupled to the second control terminal P2 and a second terminal thereof is coupled to the gate low voltage VGL.

The control signal generator 331 includes transistors T1 and T2. A first terminal of the transistor T1 is coupled to the first control terminal P1, a control terminal thereof receives the first bias voltage V1, and a second terminal thereof is coupled to the gate low voltage VGL. A first terminal and a control terminal of the transistor T2 all receive the first bias voltage V1, and a second terminal thereof is coupled to the second control terminal P2, where the transistor T2 is coupled in a diode connection, and is used as a diode. The control signal generator 332 includes transistors T5 and T6. A first terminal and a control terminal of the transistor T5 all receive the second bias voltage V2, and a second terminal thereof is coupled to the first control terminal P1. A first terminal of the transistor T6 is coupled to the second control terminal P2, a control terminal thereof receives the second bias voltage V2, and a second terminal thereof is coupled to the gate low voltage VGL, where the transistor T5 is coupled in a diode connection, and is used as a diode.

The backup control signal generator 341 includes transistors T3 and T4. A first terminal of the transistor T3 is coupled to the first control terminal P1, a control terminal thereof receives the first backup bias voltage V11, and a second terminal thereof is coupled to the gate low voltage VGL. A first terminal and a control terminal of the transistor T4 all receive the first backup bias voltage V11, and a second terminal thereof is coupled to the second control terminal P2, where the transistor T4 is coupled in a diode connection, and is used as a diode. The backup control signal generator 342 includes transistors T7 and T8. A first terminal and a control terminal of the transistor T7 all receive the second backup bias voltage V22, and a second terminal thereof is coupled to the first control terminal P1. A first terminal of the transistor T8 is coupled to the second control terminal P2, a control terminal thereof receives the second backup bias voltage V22, and a second terminal thereof is coupled to the gate low voltage VGL, where the transistor T7 is coupled in a diode connection, and is used as a diode.

It should be noted that in the present embodiment, an aspect ratio of current channels of the transistors in the backup control signal generators 341 and 342 are increased be greater than (for example, is an integer multiple of) an aspect ratio of current channels of the transistors in the control signal generators 331 and 332, so as to improve reliability of a long-time operation (for example, a high temperature operation or a high temperature high humidity operation) (since a relatively large aspect ratio results in a relatively small resistance, and a working temperature of the transistor is relatively decreased). Moreover, a method for increasing the aspect ratio is to enlarge a width of the current channel or shorten a length of the current channel, which is not limited by the invention. Therefore, in the present embodiment, the aspect ratio of the transistor T3 is greater than the aspect ratio of the transistor T1 (for example, a ratio of the aspect ratios of the transistor T3 and the transistor T1 is 2:1). The aspect ratio of the transistor T4 is greater than the aspect ratio of the transistor T2 (for example, a ratio of the aspect ratios of the transistor T4 and the transistor T2 is 2:1). The aspect ratio of the transistor T7 is greater than the aspect ratio of the transistor T5 (for example, a ratio of the aspect ratios of the transistor T7 and the transistor T5 is 2:1). The aspect ratio of the transistor T8 is greater than the aspect ratio of the transistor T6 (for example, a ratio of the aspect ratios of the transistor T8 and the transistor T6 is 2:1).

The output stage circuit 320 includes a transistor T37, a transistor T38, a transistor T39 and a capacitor C1. A first terminal of the transistor T37 receives the clock signal CK, a control terminal thereof is coupled to the driving terminal Q and a second terminal thereof receives the output signal G(N). A first terminal of the transistor T38 receives the output signal G(N), a control terminal thereof receives the first control voltage VP and a second terminal thereof is coupled to the gate low voltage VGL. A first terminal of the transistor T39 receives the output signal G(N), a control terminal thereof receives the second control voltage VP2 and a second terminal thereof is coupled to the gate low voltage VGL. A first terminal of the capacitor C is coupled to the control terminal of the transistor T37, and a second terminal thereof is coupled to the second terminal of the transistor T37.

Figure 3B:
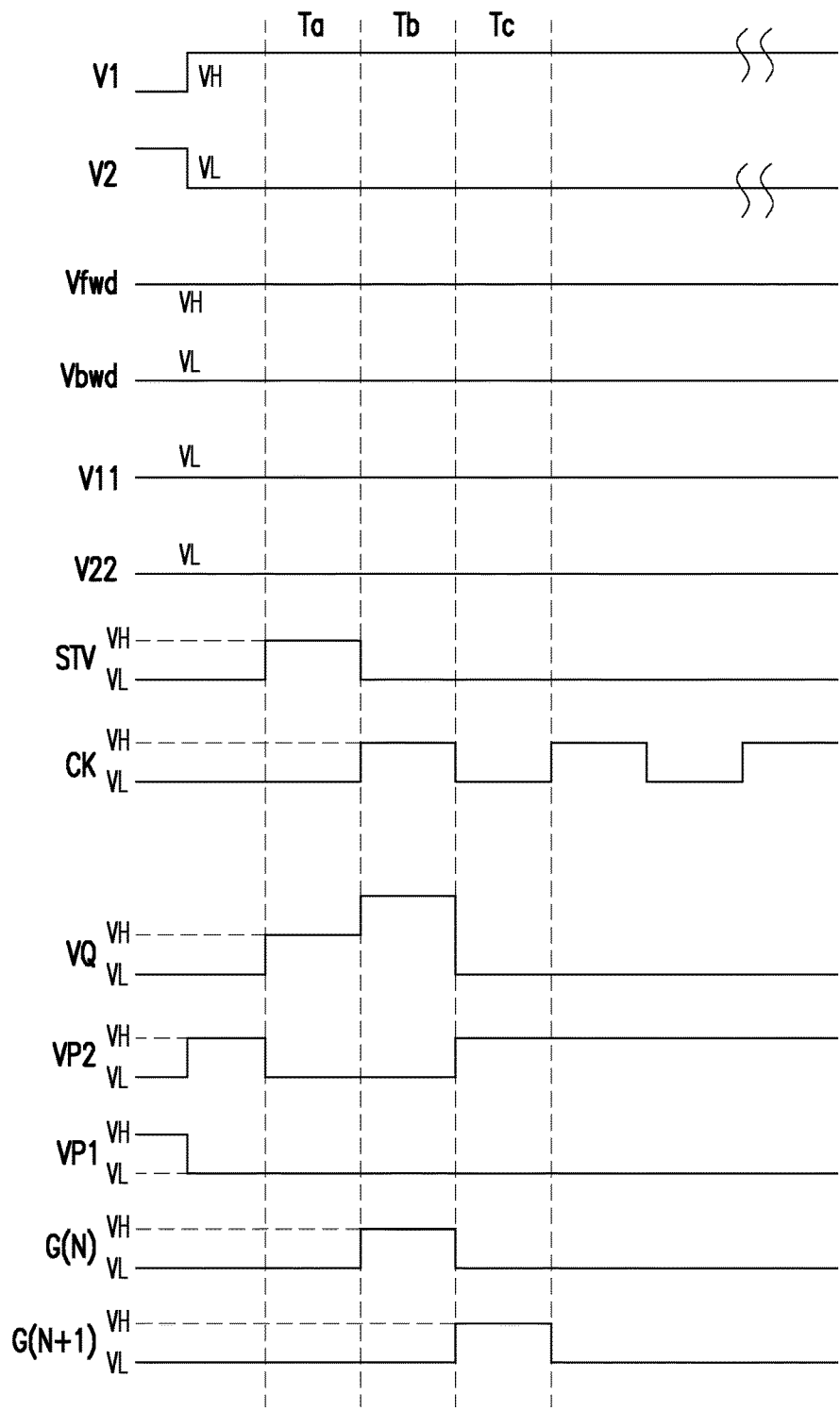
FIG. 3B is a waveform diagram of an operation mode of a shift register of the embodiment of FIG. 3A.

Referring to FIG. 3A and FIG. 3B for a detailed circuit operation, FIG. 3A is a schematic diagram of a shift register according to another embodiment of the invention. FIG. 3B is a waveform diagram of an operation mode of the shift register of the embodiment of FIG. 3A. In the present embodiment, when the shift register 300 is operated in the operation mode of FIG. 3B, in the first bias voltage V1, the second bias voltage V2, the first backup bias voltage V11 and the second backup bias voltage V22, only the first bias voltage V1 is a first voltage level (for example, a high voltage level VH), so as to enable the control signal generators 331 and 332 and the backup control signal generators 341 and 342 in time-division.

In detail, in a first time interval Ta, the transistor T31 of the shift register 300 is turned on according to the start scanning signal STV having the first voltage level (the high voltage level VH), and provides the first voltage Vfwd having the first voltage level (the high voltage level VH) to the driving terminal Q. The transistors T33 and T34 are turned on according to the voltage VQ on the driving terminal Q that has the first voltage level (the high voltage level VH), and pull down the first control voltage VP1 and the second control voltage VP2 to a second voltage level (for example, a low voltage level VL) according to the gate low voltage VGL. The transistor T37 of the output stage circuit 320 is turned on according to the voltage VQ on the driving terminal Q (the high voltage level VH), and generates the output signal G(N) according to the clock signal CK of the second voltage level (the low voltage level VL), where the first voltage level is greater than the second voltage level.

Then, in a second time interval Tb after the first time interval Ta, the clock signal CK is transited from the low voltage level VL to the high voltage level VH, and the turned-on transistor T37 charges the output signal G(N), and the voltage level of the output signal G(N) is transited to the high voltage level VH. Meanwhile, through a bootstrap effect on the voltage VQ of the driving terminal Q produced by the capacitor C1, the voltage VQ on the driving terminal Q is pulled up to a third voltage level (which is, for example, greater than the high voltage level VH). In this way, the output signal G(N) may be more completely output, and now the first control voltage VP1 and the second control voltage VP2 are still maintained to the second voltage level (the low voltage level VL), where the third voltage level is greater than the first voltage level.

In a third time interval Tc after the second time interval Tb, the transistor T32 is turned on according to the (N+1)$^{th}$ stage output signal G(N+1) transited to the first voltage level (the high voltage level VH), and provides the second voltage Vbwd having the second voltage level (the low voltage level VL) to the driving terminal Q. Meanwhile, the transistor T33 and the transistor T34 are turned off according to the voltage VQ on the driving terminal Q that has the second voltage level (the low voltage level VL). The transistor T1 is turned on according to the first bias voltage V1 having the first voltage level (the high voltage level VH), and pulls down the first control voltage VP1 to the gate low voltage VGL. Moreover, the first bias voltage V1 pulls up the voltage level of the second control voltage VP2 through the transistor T2 coupled in the diode connection. The transistor T36 and the transistor T39 are turned on according to the second control voltage VP2 transited to the first voltage level (the high voltage level VH), and pull down the voltage levels of the voltage VQ on the driving terminal Q and the output signal G(N) to the gate low voltage VGL, so as to avoid a floating state of the driving terminal Q and the output signal G(N) during a non-working period of the circuit. The so-called floating state represents a state of the corresponding terminal (or signal) that is not applied with a valid voltage.

Figure 3C:
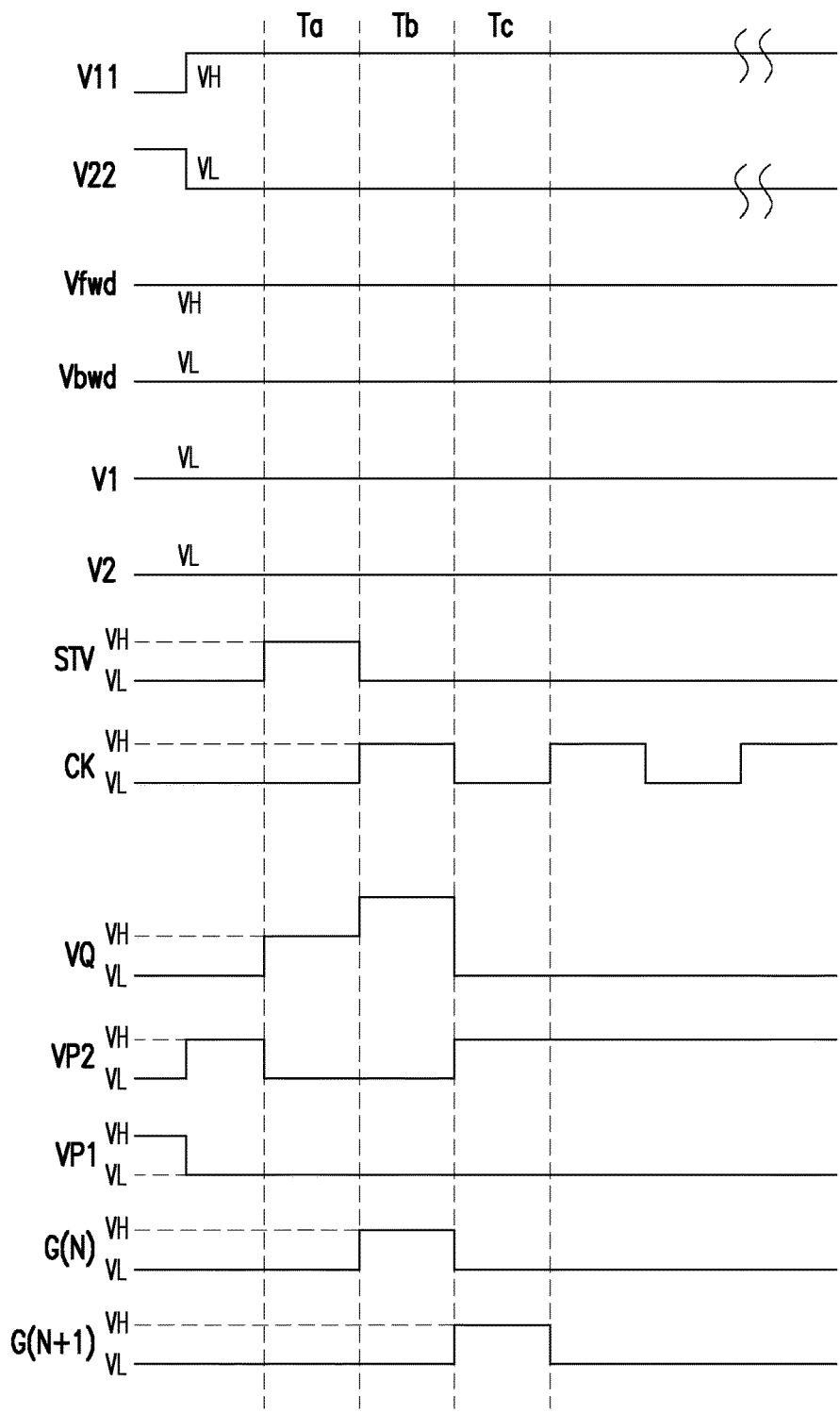
FIG. 3C is a waveform diagram of another operation mode of the shift register of the embodiment of FIG. 3A.

Referring to FIG. 3A and FIG. 3C, FIG. 3A is a schematic diagram of a shift register according to another embodiment of the invention. FIG. 3C is a waveform diagram of another operation mode of the shift register of the embodiment of FIG. 3A. Different to the operation mode of FIG. 3B, an operating frequency of the shift register 300 of the operation mode of the present embodiment may result in a high reliability of the circuit in the long-time operation through the backup control signal generators 341 and 342. Moreover, when the circuit of such operation mode operates, in the first bias voltage V1, the second bias voltage V2, the first backup bias voltage V11 and the second backup bias voltage V22, only the first backup bias voltage V11 has the first voltage level (for example, the high voltage level VH), so as to enable the control signal generators 331 and 332 and the backup control signal generators 341 and 342 in time-division.

Detailed circuit operation is similar to that of the operation mode of the shift register 300 of FIG. 3B, which is not repeated.

In summary, the invention provides a shift register device used for setting a gate on array (GOA) circuit, besides that the GOA circuit may be operated in the operating frequency with better tough sensitivity through the original at least two control signal generates, the GOA circuit may also be operated in other different operating frequencies through the additionally added at least two backup control signal generators, so as to have selectivity for different operating frequencies. Moreover, by enlarging the channel aspect ratio of the transistors in the backup control signal generators, reliability of the circuit in long-time operation is increased.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A shift register device, comprising:
    a plurality of shift registers, coupled to each other in series, wherein an $N^{th}$ stage shift register comprises:
    a voltage setting circuit, receiving a start scanning signal and an $(N+1)^{th}$ stage output signal, and providing a first voltage or a second voltage to a driving terminal according to the start scanning signal and the $(N+1)^{th}$ stage output signal, wherein the start scanning signal is an $(N-1)^{th}$ stage output signal;
    at least two control signal generators, coupled to a first control terminal and a second control terminal, wherein the at least two control signal generators respectively receive at least two bias voltages, and respectively generate a first control voltage on the first control terminal and a second control voltage on the second control terminal according to the at least two bias voltages;
    at least two backup control signal generators, coupled to the first control terminal and the second control terminal, wherein the at least two backup control signal generators respectively receive at least two backup bias voltages, and respectively generate the first control voltage and the second control voltage according to the at least two backup bias voltages;
    an output stage circuit, coupled to the driving terminal, the first control terminal and the second control terminal, and generating an output signal according to a voltage on the driving terminal, the first control voltage and the second control voltage,
    wherein N is a positive integer.

2. The shift register device as claimed in claim 1, wherein the at least two bias voltages comprise a first bias voltage and a second bias voltage, and the at least two control signal generators comprise:
    a first control signal generator, wherein when the first bias voltage is an enable voltage level, the first control signal generator pulls down the first control voltage to a gate low voltage according to the first bias voltage, and pulls up the second control voltage according to the first bias voltage; and
    a second control signal generator, wherein when the second bias voltage is the enable voltage level, the second control signal generator pulls up the first control voltage according to the second bias voltage, and pulls down the second control voltage to the gate low voltage according to the second bias voltage.

3. The shift register device as claimed in claim 2, wherein the at least two backup bias voltages comprise a first backup bias voltage and a second backup bias voltage, and the at least two backup control signal generators comprise:
    a first backup control signal generator, wherein when the first backup bias voltage is the enable voltage level, the first backup control signal generator pulls down the first control voltage to the gate low voltage according to the first backup bias voltage, and pulls up the second control voltage according to the first backup bias voltage; and
    a second backup control signal generator, wherein when the second backup bias voltage is the enable voltage level, the second backup control signal generator pulls up the first control voltage according to the second backup bias voltage, and pulls down the second control voltage to the gate low voltage according to the second backup bias voltage.

4. The shift register device as claimed in claim 3, wherein the first control signal generator comprises:
    a first transistor, having a first terminal coupled to the first control terminal, a control terminal receiving the first bias voltage, and a second terminal coupled to the gate low voltage; and
    a second transistor, having a first terminal and a control terminal receiving the first bias voltage, and a second terminal coupled to the second control terminal; and
    the first backup control signal generator comprises:
    a third transistor, having a first terminal coupled to the first control terminal, a control terminal receiving the first backup bias voltage, and a second terminal coupled to the gate low voltage; and
    a fourth transistor, having a first terminal and a control terminal receiving the first backup bias voltage, and a second terminal coupled to the second control terminal,
    wherein an aspect ratio of the third transistor is greater than an aspect ratio of the first transistor, and an aspect ratio of the fourth transistor is greater than an aspect ratio of the second transistor.

5. The shift register device as claimed in claim 4, wherein in the first control signal generator and the first backup control signal generator, the aspect ratio of the third transistor is an integer multiple of the aspect ratio of the first transistor, and the aspect ratio of the fourth transistor is an integer multiple of the aspect ratio of the second transistor.

6. The shift register device as claimed in claim 3, wherein the second control signal generator comprises:
   a first transistor, having a first terminal and a control terminal receiving the second bias voltage, and a second terminal coupled to the first control terminal; and
   a second transistor, having a first terminal coupled to the second control terminal, a control terminal receiving the second bias voltage, and a second terminal coupled to the gate low voltage; and
   the second backup control signal generator comprises:
   a third transistor, having a first terminal and a control terminal receiving the second backup bias voltage, and a second terminal coupled to the first control terminal; and
   a fourth transistor, having a first terminal coupled to the second control terminal, a control terminal receiving the second backup bias voltage, and a second terminal coupled to the gate low voltage,
   wherein an aspect ratio of the third transistor is greater than an aspect ratio of the first transistor, and an aspect ratio of the fourth transistor is greater than an aspect ratio of the second transistor.

7. The shift register device as claimed in claim 6, wherein in the second control signal generator and the second backup control signal generator, the aspect ratio of the third transistor is an integer multiple of the aspect ratio of the first transistor, and the aspect ratio of the fourth transistor is an integer multiple of the aspect ratio of the second transistor.

8. The shift register device as claimed in claim 1, wherein at most one of the first bias voltage, the second bias voltage, the first backup bias voltage and the second backup bias voltage has a high voltage level.

9. The shift register device as claimed in claim 1, wherein the voltage setting circuit comprises:

a first transistor, having a first terminal receiving the first voltage, a control terminal receiving the start scanning signal, and a second terminal coupled to the driving terminal;
a second transistor, having a first terminal receiving the second voltage, a control terminal receiving the $(N+1)^{th}$ stage output signal, and a second terminal coupled to the driving terminal;
a third transistor, having a first terminal coupled to the first control terminal, a control terminal coupled to the driving terminal, and a second terminal coupled to the gate low voltage;
a fourth transistor, having a first terminal coupled to the second control terminal, a control terminal coupled to the driving terminal, and a second terminal coupled to the gate low voltage;
a fifth transistor, having a first terminal coupled to the driving terminal, a control terminal coupled to the first control terminal, and a second terminal coupled to the gate low voltage; and
a sixth transistor, having a first terminal coupled to the driving terminal, a control terminal coupled to the second control terminal, and a second terminal coupled to the gate low voltage.

10. The shift register device as claimed in claim 9, wherein the output stage circuit comprises:
   a seventh transistor, having a first terminal receiving a clock signal, a control terminal coupled to the driving terminal, and a second terminal receiving the output signal;
   an eighth transistor, having a first terminal receiving the output signal, a control terminal receiving the first control voltage, and a second terminal coupled to the gate low voltage;
   a ninth transistor, having a first terminal receiving the output signal, a control terminal receiving the second control voltage, and a second terminal coupled to the gate low voltage; and
   a capacitor coupled between the control terminal and the second terminal of the seventh transistor.

\* \* \* \* \*